US007174633B2

(12) United States Patent
Onuma

(10) Patent No.: US 7,174,633 B2
(45) Date of Patent: Feb. 13, 2007

(54) METHOD OF CONNECTING TERMINAL AND ELECTRIC WIRE

(75) Inventor: Masanori Onuma, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 415 days.

(21) Appl. No.: 10/741,433

(22) Filed: Dec. 22, 2003

(65) Prior Publication Data

US 2004/0168315 A1 Sep. 2, 2004

(30) Foreign Application Priority Data

Dec. 20, 2002 (JP) .......................... P2002-369388

(51) Int. Cl.
*H01R 43/00* (2006.01)
*H05K 13/00* (2006.01)

(52) U.S. Cl. ............................ 29/854; 29/857; 29/859; 29/861; 29/868; 439/877

(58) Field of Classification Search .......... 29/862–868, 29/871, 874, 882, 412; 439/879, 877, 860, 439/883; 174/35 R, 84 R, 152 G
See application file for complete search history.

(56) References Cited

U.S. PATENT DOCUMENTS 4,998,344 A * 3/1991 Hsieh .................... 29/894.362
6,438,828 B1 * 8/2002 Uchiyama .................... 29/868
6,893,301 B2 * 5/2005 Kuwayama et al. ........ 439/877
6,951,491 B2 * 10/2005 Sakaguchi et al. .......... 439/879

FOREIGN PATENT DOCUMENTS

JP 11-086921 A 3/1999
JP 2000-285983 A 10/2000
JP 2002-229656 A 8/2002

* cited by examiner

*Primary Examiner*—Minh Trinh
(74) *Attorney, Agent, or Firm*—Sughrue Mion, PLLC

(57) ABSTRACT

The invention comprises filling a conductive adhesive on a hole end of a wire connection part in tubular shape of the terminal which has an electric contact part at one side and the wire connection part at the other side, inserting an electric wire from a hole opening of the wire connection part toward the hole end, and reducing evenly a size of a tubular wall of the wire connection part, thereby causing the conductive adhesive to infiltrate into a space of the electric contact part or between wires. The invention also comprises tightening the tubular wall of the wire connection part by a rotary swaging process. Further, the conductive adhesive is a nickel paste which is a mixture of nickel powders in a liquid epoxy resin based binder. In addition, at least one of a core wire portion of the electric wire or the terminal is aluminum or aluminum alloy.

4 Claims, 3 Drawing Sheets

METHOD OF CONNECTING TERMINAL AND ELECTRIC WIRE

The present application is based on Japanese Patent Application No. 2002-369388, the entire contents of which are incorporated herein by reference.

BACKGROUND OF THE INVENTION

1. Field of the Invention

The invention relates to a method of connecting a terminal and an electric wire, which connects the terminal to be connected to, for example, a car panel or an engine block and the an electric wire supplying an earth current.

2. Related Art

As one of examples of a related art concerned with this kind of connecting method of the terminal and the electric wire, known are those shown in FIGS. 5 and 6 (See Japanese Patent Publications Nos. JP H11-86921A and JP 2000-285983A.).

As shown in FIG. 5, a first related art (Japanese Patent Publication No. JPH11-86921A, pp. 2 to 4 & FIG. 7) lessens invasion of a sealing material 58 into a wire connection part between a core wire portion 57*a* and the terminal 50 for realizing stable electrical connection, and closing an electric wire insertion hole 53 of a small diameter pipe 52 with the core wire portion 57*a*.

A terminal 50 is made by connecting through forcing to press a small diameter pipe 52 into a large diameter pipe 51 being different in diameter or welding both, and has a wire connection part 55 at one side and an electric contact part 56 at the other side. Both sides are opened, and an electric wire 57 is inserted into one opening end of the small diameter pipe 52, while a water tight member 54 is inserted into the other opening end of the small diameter pipe 52.

An inner diameter of the small diameter pipe 52 is formed to be somewhat larger than an outer diameter of the electric wire 57, and a border between an insulation covering portion 57*b* and a core wire portion 57*a* is positioned at the inside of the small diameter pipe 52, and if tightening a tubular wall of the small diameter pipe 52, the electric wire 57 is closely adhered to the inside of the small diameter pipe 52. The water tight member 54 is an elastic plate rubber, and if pressing the other opening end of the small diameter pipe 52 from an direction of a plate thickness of the water tight member 54, the electric wire 57 and the small diameter pipe 52 are held leaving no space.

Subsequently, a sealing material 58 is poured into an opening of the large diameter pipe 51, and a waterproof is provided at a connection between the electric wire 57 and the small diameter pipe 52. Being under the condition of no space between the electric wire 57 and the small diameter pipe 52, the sealing material 58 does not flow into a side of the small diameter pipe 52.

As shown in FIG. 6, a second related art (Japanese Patent Publication No. JP 2000-285983A, pp. 2 to 3 & FIG. 2) provides a complete waterproof in a wire connection part 62 of a terminal 60 by closely adhering a heat shrinkage tube 63 over the wire connection part 62.

A terminal 60 comprises an electric contact part 61 shaped in a round plate and a wire connection part 62 having pairs of front and rear crimping pieces 62*a*, 62*b*. The electric contact part 61 is formed with a bolt (not shown) insertion hole 61*a* for connecting to a car body. The front crimping piece 62*a* of the wire connection part 62 is crimped with a core wire portion 65*a* of the electric wire 65, while the rear crimping piece 62*b* is crimped with an insulation covering portion 65*b* of the electric wire 65. The wire connection part 62 is closely covered over with the heat shrinkage tube 63 coated on an inner circumference with an adhesive agent such as a hot melt.

However, the above mentioned prior methods of connecting the terminal and the electric wire are involved with problems to be solved, as follows.

In the first related art, the terminal 50 is composed by connecting the large diameter pipe 51 and the small diameter pipe 52, and for connecting the terminal 50 and the electric wire 57, the plate rubber as the water tight member 54 and the sealing material 58 are necessitated, resulting in increasing the number of parts and members and heightening cost, accordingly.

As the connection between the large diameter pipe 51 and the small diameter pipe 52 is conducted by press fitting or welding, there arises a problem that the operation is troublesome. Besides, it is possible that the connection portion does not have sufficient sealing condition due to welding defects, or pressure shortage during connecting operation by press fitting. In such the case, there is a fear that the sealing material 58 injected from the opening of the large diameter pipe 51 could leak out.

Further, since the tubular wall of the small diameter pipe 52 is tightened under the condition that the border between the insulation covering portion 57*b* and the core wire portion 57*a* is positioned at the inside of the small diameter pipe 52, it is difficult that the core wire portion 57*a* and the inside of the small diameter pipe 52 are closed, causing fear of poor contact.

The second related art heats the shrinkage tube 63 to a predetermined temperature to reduce the size thereof in order to cover the wire connection part 62 of the terminal 60 for attaining the waterproof and an insulation, but since rate of shrinkage is decided depending on sizes or material qualities, those should be used properly, and a problem is present in a connection workability being inferior.

In case the heat shrinkage tube 63 is used on the inside with the hot melt as an adhesive, owing to heating of the wire connection part 62, the hot melt is heated and melts (a softening temperature is around 80° C.), and the waterproofing property of the heat shrinkage tube 63 might be spoiled. Particularly, in the case that an aluminum electric wire is connected to the terminal 60, contact resistance becomes higher by formation of an oxidized film at the connection portion. As a result, the connection portion could be abnormally heated more easily, thereby causing a melting of the hot melt adhesive.

SUMMARY OF THE INVENTION

In view of the above mentioned circumstances, accordingly it is an object of the invention to provide a method of connecting a terminal and an electric wire, being capable of waterproofing the wire connection part with less member of parts and at low cost, and effecting stable electrical conductivity.

For accomplishing the above object, the invention of a first aspect is characterized by comprising filling a conductive adhesive on a hole end of a wire connection part of the terminal which has an electric contact part at one side and the wire connection part in tubular shape at the other side, inserting an electric wire from a hole opening of the wire connection part toward the hole end, and tightening uniformly a tubular wall of the wire connection part, thereby infiltrating the conductive adhesive into a space of the electric contact part or between wires.

The invention also provides a structure of connecting a terminal and an electric wire, comprising:

the terminal including an electric contact part at one side thereof and a tubular wire connection part at another end thereof; and the wire inserted into the wire connection part;

wherein a hole end of the wire connection part is filled with a conductive adhesive, and the conductive adhesive is infiltrated into a space of the electric contact part or between wires of said electric wire by tightening the wire connection part uniformly.

According to the above structure, the conductive adhesive goes into spaces in a side of the electric contact part or spaces in the electric wire by pressure effected when tightening the tubular wall. If the conductive adhesive goes into the space in the side of the electric contact part, the space is closed by the conductive adhesive, and a water is prevented from invading into the wire connection part from an exterior. If the conductive adhesive goes into between wires, the contact resistance is low between the mutual wires, and the electrical conductivity is heightened.

The invention of a second aspect is characterized, in the connecting method of the terminal and the electric wire as set forth in the first aspect, by comprising tightening the tubular wall of the wire connection part by a rotary swaging process.

According to the above structure, a plurality of dice arranged radially in the rotary swaging apparatus are moved to a radial direction in cooperation with backers (hammers), so that the terminal is struck at the tubular wall periodically and the tubular wall is tightened evenly all over the circumference, and the terminal and the electric wire are closely adhered. Therefore, no space is formed between the terminal and the electric wire to more heighten the waterproofing property as well as heighten the electrical conductivity between the terminal and the electric wire.

The invention of a third aspect is characterized, in the method of connecting the terminal and the electric wire as set forth in the first or second aspect, in that the conductive adhesive is a nickel paste which is a mixture of nickel powders in a liquid epoxy resin based binder.

According to the above structure, since an epoxy resin as the binder is thermosetting, a curing time is short to heighten the connection workability of the terminal and the electric wire, and being irreversible, if being once hardened, the waterproofing property is maintained for a long period of time. Since the nickel power is conductive, the electrical conductivity between the core wire portion and the wire connection part is satisfactory.

The invention of a fourth aspect is characterized, in the connecting method of the terminal and the electric wire as set forth in any one of the first to third aspects, in that at least one of a core wire portion of the electric wire or the terminal is aluminum or aluminum alloy.

According to the above structure, since the nickel paste and the aluminum alloy contact at low contact resistance, a satisfactory electrical conductivity may be available. In addition, when the tubular wall of the wire connection part is tightened, since the nickel powder as a conductive filler of the nickel paste breaks through an amorphous oxidized film of the aluminum alloy and the nickel powder directly contacts an underground layer of the aluminum alloy, the terminal and the electric wire can be connected without performing a pretreatment for removing the oxidized film. Further, if using an aluminum electric wire, a vehicle such as an automobile is lightened in weight comparing with using a copper electric wire.

DETAILED DESCRIPTION OF THE PREFERRED EMBODIMENTS

Explanation will be made in detail to embodied examples of the invention, referring to the attached drawings.

FIGS. 1 to 4 show one embodiment of the connecting method of the terminal and the electric wire.

Figure 1:
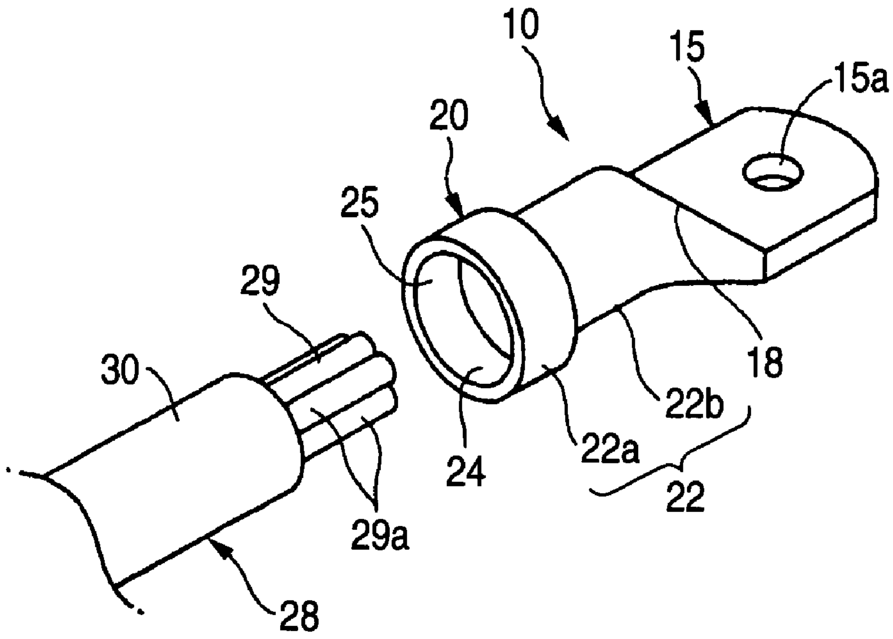
FIG. 1 is a disassembled perspective view in one embodiment of the method of connecting a terminal and an electric wire according to the invention.

FIG. 1 shows an earth terminal (terminal) of the aluminum alloy as a composing material and an aluminum electric wire (electric wire) 28 to be connected to the earth terminal. An earth current flows in the aluminum electric wire 28 and to a car panel or an engine block (both not shown) through the earth terminal 10.

The aluminum electric wire 28 is made of a core wire portion 29 composed of plural wires **29*a* and an insulation covering portion 30 covering the circumference of the core wire portion 29. In the present embodiment, the core wire portion 29** is composed of the aluminum alloy, but the invention does not limit to the aluminum alloy, but may employ aluminum, copper or Cu alloy. Using Al or aluminum alloy in substitution for Cu or Cu alloy, specific gravity becomes around ⅓, so that a vehicle as a car is lightened in weight.

The insulation covering portion 30 is made of a synthetic resin material excellent in the heat resistance such as polypropylene. Depending on kinds of resin materials, used are those added with plastic materials (polyvinylchloride resin), or those treated with cross-linking (polyvinylchloride resin, or polyethylene resin).

The earth terminal 10 has the plate shaped electric contact part 15 at one end of a blank piece which is obtained by cutting a lengthy pipe blank material of Al alloy into predetermined length, and has the wire connection part 20 at the other end of the blank piece. The electric contact part 15 and the wire connection part 20 are connected via a connection 18.

The electric contact part 15 is shaped in plate by pressing the blank piece, and a space 16 at a middle part in the thickness direction. The electric contact part 15 is penetrated at a center with a bolt passing hole **15*a* into which a tightening bolt (not shown) is inserted to fasten the tightening bolt so that the earth terminal 10** is connected to a car panel or an engine block.

The electric contact part of this embodiment is so-called male, but the invention does not limit to the male typed electric contact part, and is enough with a female electric contact part being tubular for accepting an opposite electric contact part. For example, a so-called round pin terminal may be employed which is formed by machining. The round pin terminal is made in that the electric contact part and the wire connection part are connected via a central partition, and the electric contact part is formed inside with a spring piece, and when the opposite electric contact part is inserted, the spring piece urges to press the electric contact part, and both electric contact parts are electrically connected.

The wire connection part 20 has a stepped tubular shape where a large diameter portion 22*a* is defined at an end side and a small diameter portion 22*b* continues from the large diameter portion 22*a*, and an electric wire insertion hole 24 is defined inside for inserting the aluminum electric wire 28. The large diameter portion 22*a* and the small diameter portion 22*b* are coaxial. The large diameter portion 22*a* is made by expanding the diameter of the hole opening of the blank piece by a tube expanding process.

The tube expanding process is also called as a flaring process or an expand process, and includes many kinds of the processing methods. For example, the tube is expanded by pushing a punch from the hole opening in an axial direction of the pipe blank material, or effecting oil pressure to a pipe inside by an oil pressure apparatus.

Having depended on the tube expanding process, the large diameter portion 22*a* is smaller in thickness than the small diameter portion 22*b*. Therefore, when the tubular wall 22 of the wire connection part 20 is subjected to a rotary swaging process through the dice of a stepped shape, the large diameter portion 22*a* is more easily effected by compression-deformation than the small diameter portion 22*b*, so that the insulation covering portion 30 is closely adhered to the large diameter portion 22*a*.

Figure 2:
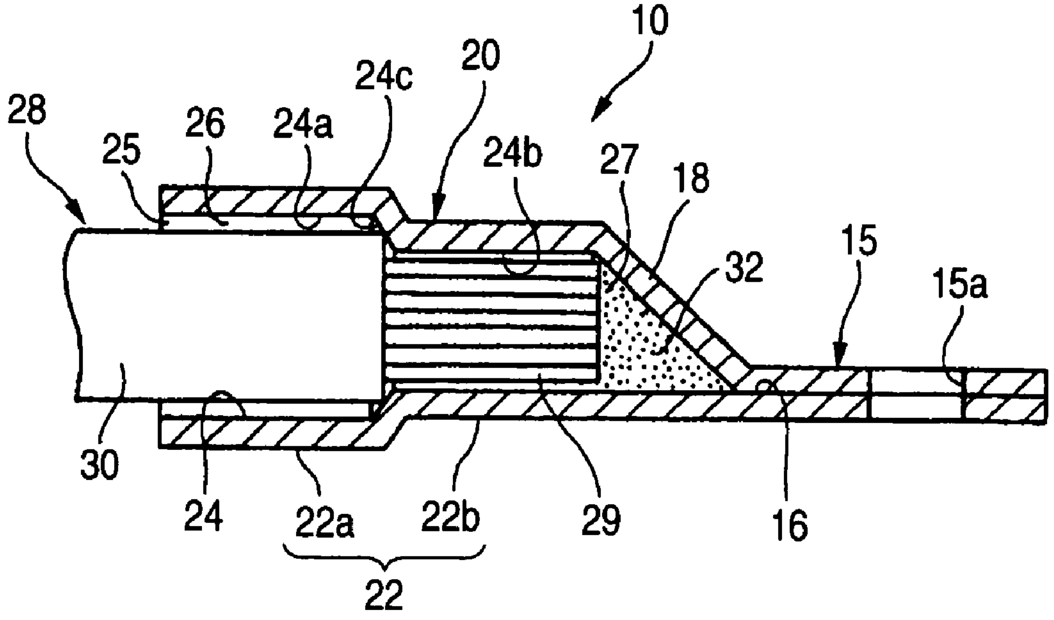
FIG. 2 is a vertical longitudinal cross sectional view under a condition where the aluminum electric wire is inserted into the earth terminal prior to the rotary swaging process.

FIG. 2 is a vertically cross sectional view showing a condition where the aluminum electric wire 28 is inserted into the earth terminal 10 prior to the rotary swaging process. The electric wire insertion hole 24 has a small hole portion 24*b* and a large hole portion 24*a*, and is formed with a so-called blind hole. The aluminum electric wire 28 inserted from the hole opening 25 is therefore prevented from getting out in the inserting direction.

The inner diameter of the small hole portion 24*b* is equal to or somewhat larger than the outer diameter of the core wire portion 29, because if the inner diameter of the small hole portion 24*b* is smaller than the outer diameter of the core wire portion 29, the core wire portion 29 cannot be inserted into the small hole portion 24*b*. The inner diameter of the large hole portion 24*a* is larger than the outer diameter of the insulation covering portion 30, because if the inner diameter of the large hole portion 24*a* is equal to or smaller than the outer diameter of the insulation covering portion 30, an air does not escape when rotary swaging, and the tubular wall 22 of the wire connection part 20 cannot be tightened. Since the insulation covering portion 30 is formed with a soft resin excellent in heat resistance, when tightening the tubular wall 22, the space 26 of the hole opening 25 as an opening end is perfectly closed.

A hole length (hole depth) of the small hole portion 24*b* is equal to or larger than an exposed length of the core wire portion 29, because if being shorter than the exposed length of the core wire portion 29, a contact area of the core wire portion 29 and the small hole portion 24*b* is made small so that the electrical conductivity decreases. The hole length of the large hole portion 24*a* is made formed to closely hold the insulation covering portion 30 such that the aluminum electric wire 28 does not get out rearward.

In regard to the aluminum electric wire 28 inserted in the electric wire insertion hole 24 of the wire connection part 20, the core wire portion 29 is placed at the small diameter portion 22*b*, and the insulation covering portion 30 is placed at the large diameter portion 22*a* and contacts at an end to the stepped part 24*c* of the electric wire insertion hole 24, so that the aluminum electric wire 28 is positioned in the inserting direction.

The connection 18 placed between the electric contact part 15 and the wire connection part 20 is tapered. A back side of the connection 18 is an innermost of the electric wire insertion hole 24, and a front end of the core wire portion 29 is opposite to the back side of the connection 18, leaving a little space. The space is a room for the nickel paste (conductive adhesive) 32 serving as the waterproof, and the nickel paste 32 closes the space 16 in a seam of the electric contact part 15.

The invention is characterized in that the earth terminal 10 comprising the pipe blank material of one body has, at one end, the plate shaped electric contact part 15 of the pressed pipe blank materials being piled up and down, and has, at the other end, the wire connection part 20 composed of the large diameter portion 22*a* and the small diameter portion 22*b* and having inside the electric wire insertion hole 24 of the stepped tubular shape, the nickel paste 32 is filled on the hole end 27 of the electric wire insertion hole 24 for closing the space 16 communicating with the electric contact part 15, the aluminum electric wire 28 is inserted to the hole end 27 from the hole opening 25 of the electric wire insertion hole 24, and the large diameter portion 22*a* and the small diameter portion 22*b* of the wire connection part 20 are tightened by the rotary swaging process, thereby to infiltrate the nickel paste 32 into the space 16 of the electric contact part 15 and into between the wires 29*a*.

Figure 6:
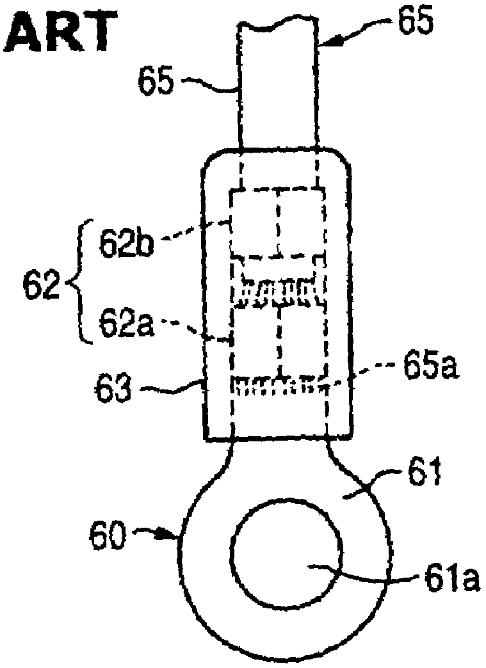
FIG. 6 PRIOR ART
FIG. 6 is a plan view showing one example of the prior connecting method of the terminal and the electric wire.

The earth terminal 10 is formed as one body with the pipe blank material, and therefore, it is not necessary to connect pipes different in outer diameter as the prior example (FIG. 6), and forming of the earth terminal 10 is easy. Since the waterproofing nickel paste 32 is filled on the hole end 27 of the electric wire insertion hole 24 placing the core wire portion 29 of the aluminum electric wire 28, when tightening the tubular wall 22 of the wire connection part 20, the nickel paste 32 flows along the hole opening 25 and the hole end 27 of the electric wire insertion hole 24, and concurrently goes into between the wires 29*a*. By the way, in a case of the round pin terminal having the female typed electric contact part, the nickel paste is filled in the electric wire insertion hole as the so-called blind hole, and the nickel paste goes into the space between the insulation covering portion and the electric wire insertion hole and into between the wires.

Flowing to the side of the hole opening 25, the nickel paste 32 goes into the space 26 between the insulation covering portion 30 and the electric wire insertion hole 24. Flowing to the side of the hole end 27, the nickel paste 32 goes into the space 16 in a seam of the electric contact part 15 and into between the wires 29*a*, and the space 16 is closed to perfectly check water droplets from invading into the electric wire insertion hole 24. In addition, if the nickel paste 32 goes into between the wires 29*a* of the core wire portion 29, the contact resistance of the mutual wires decreases, and the electrical conductivity increases.

The tubular wall 22 of the wire connection part 20 is composed of the large diameter portion 22*a* for placing on the insulation covering portion 30 and the small diameter portion 22*b* for placing the core wire portion 29, and when tightening the tubular wall 22 of the wire connection part 20 by the rotary swaging process, the aluminum electric wire 28 is closely adhered to the inside of the electric wire insertion hole 24, and the hole opening 25 of the electric wire insertion hole 24 is closed to prevent the water droplets going along the aluminum electric wire 28 from invading into the electric wire insertion hole 24.

Therefore, by filling the nickel paste in the electric wire insertion hole and tightening the tubular wall 22 of the wire connection part 20, it is possible to close both spaces 16, 26 of the hole opening 25 and the hole end 27 of the electric wire insertion hole 24 without increasing the number of parts and members, and maintain the electrical conductivity between the earth terminal 10 and the aluminum electric wire 28 for a long period of time without generating corrosion.

Further, in case of connecting the aluminum electric wire 28 and the earth terminal 10 made of the aluminum alloy material by use of the nickel paste 32, the nickel powder as the conductive filler breaks through the amorphous oxidized film of the aluminum alloy by pressure generated at the swaging process, and the nickel powder directly contacts the underground layer of the aluminum alloy. Therefore, the aluminum electric wire 28 and the earth terminal 10 can be connected without performing a pretreatment for removing films of the aluminum alloy (for example, alkaline etching by an aqueous solution of sodium hydroxide, neutralization by an aqueous solution of nitric acid, or water-washing and drying).

The nickel paste 32 is the mixture of nickel powers in the binder of liquid epoxy resin group, and an adhesive of an irreversibly thermal setting type. Being thermal setting, the curing time is short to heighten the connection workability of the earth terminal 10 and the aluminum electric wire 28. As one example, the curing time is around 30 minutes at the heating temperature of 85° C., and the curing time is around 1 minute at the heating temperature of 120° C. Beside, being irreversible, if being once hardened, softening is difficult, and the nickel paste is effective in the heat resistance and the waterproof.

The nickel paste 32 is characterized in that the contact resistance to the aluminum alloy is low. The contact resistance of a silver paste and the aluminum alloy is around 6000 mΩ, and the contact resistance of a gold paste and the aluminum alloy is around 1200 mΩ, while the contact resistance of the nickel paste and the aluminum alloy is around 200 mΩ. This is assumed that activation energy of metallic bond of aluminum-nickel is high.

Figure 3:
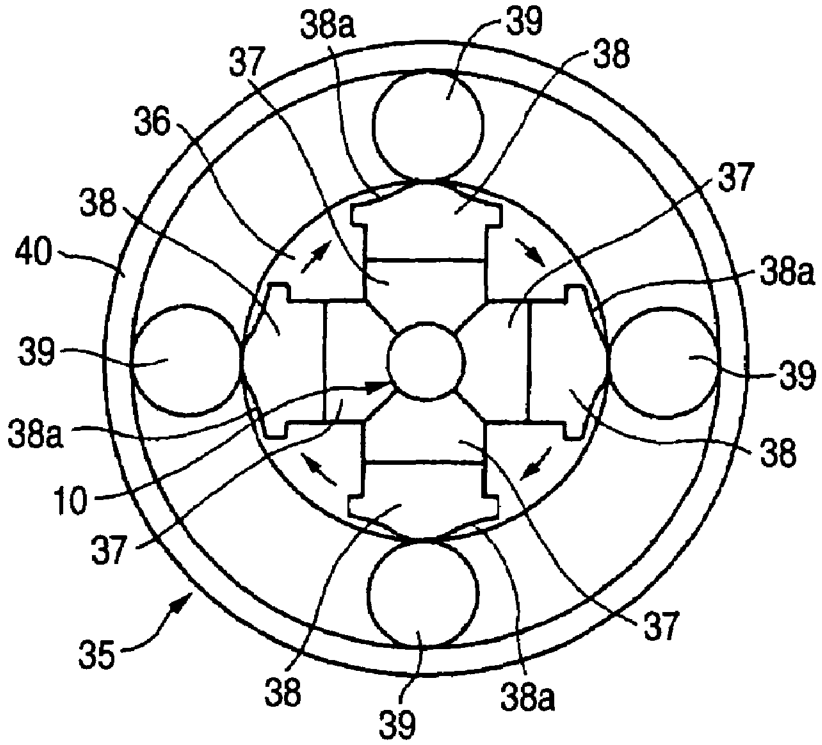
FIG. 3 is a front view of the rotary swaging apparatus for tightening the tubular wall of the earth terminal shown in FIG. 1.

Next, as to the rotary swaging process (rotary forging process) of pressing the tubular wall 22 of the earth terminal 10 all over the full circumference with uniform force in radial direction, detailed explanation will be made on the basis of FIG. 3.

The rotary swaging apparatus 35 is a spindle drive system which rotates a spindle 36 and turns the dice 37 and the backers 38. Within the spindle 36, the dice 37 and the backers **38*d* are movably held, contacting one another. In this embodiment, each two pairs of opposite dices 37, 37, 37, 37 are radially arranged. At the center of the spindle 36, the earth terminal 10 as a processing blank material is placed as being held by the insides of the dice 37**

The insides of the dice 37 are stepped, and radially arranged for simultaneously pressing the small diameter portion **22*b* and the large diameter portion 22*a* of the earth terminal 10. Therefore, comparing with a case of tightening individually the small diameter portion 22*b* and the large diameter portion 22*a***, the processing time may be shortened and the processing efficiency may be heightened.

The backer 38 arranged at the rear (outside in the radial direction) of the die 37 is separated from the die 37, but is turned in an arrow direction in cooperation with the die 37 and is moved in the radius direction (in the central direction). The die 37 and the backer 38 are secured by, e.g., bolt. The backer 38 is used in common, and the only die 37 may have another diameter size, otherwise the die 37 and the backer 38 are not separated but may be formed as one body. Moving in the radius direction depends on rotating contact of the backers 38 and guide rollers 39.

An outer circumference of the backer 38 has a cam face **38*a*. Although the cam face 38*a* is not formed at a determined radius of curvature, it is projected outside in the radius direction at a central portion in width. Therefore, when the rotating backer 38 contacts the guide roller 39, the backer 38 is urged by the guide roller 39 in the radius direction by an amount equal to the amount of the central projection, so that the die 37** is moved in the radius direction.

The guide rollers 39 are arranged equidistantly at 90° and rotatably pivoted. In the embodiment, the number of the guide rollers 39 is four equal to the number of the dice 37, but may be eight.

Further explanation will be made to a pressing condition and a non-pressing condition effected owing to relative positions of the dice 37 and the guide rollers 39. If rotating the spindle 36 by a motor (not shown), the dice 37 and the backers 38 are rotated, and at the same time the guide rollers 39 rotate by themselves. Since the backer 38 is positioned outside in the radius direction of the die 37, the rotating backer 38 and the guide roller 39 contact, and when the cam face **38*a* of the backer 38 gets on the guide roller 39, the inner surface of the backer 38 pushes inside the die 37 in the radius direction, and the tubular wall 22 of the earth terminal 10 is struck by the inside of the die 37**.

When the backer 38 and the guide roller 39 are not contacted, the backer 38 slightly projects outside in the radius direction by centrifugal force into a condition of separating the die 37 from the earth terminal 10, and striking by die 37 once stops. Again, the backer 38 and the guide roller 39 contact to repeat the above motion. In such a manner, the tubular wall 22 of the earth terminal 10 is evenly tightened by the same striking force allover the circumference, and the earth terminal 10 and the aluminum electric wire 28 are closely connected. If the earth terminal 10 and the core wire portion 29 are closely adhered at the small diameter portion **22*b***, occurrence of oxidized films of the mutual aluminum alloys is avoided, and the contact may be provided with the low contact resistance. A method of connecting the terminal and the electric wire has been already proposed in the Application No. JP-2002-229656 and U.S. Patent Publication No. 2004-0029454 A1, which claims priority from JP-2002-229656, these applications and the present application were commonly owned at the time of their respective inventions.

Figure 4:
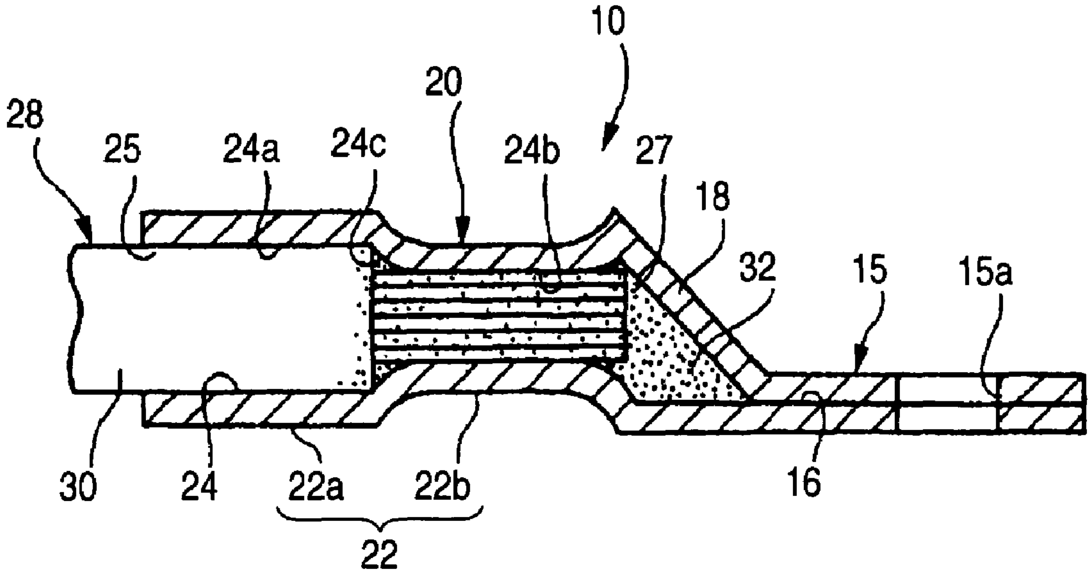
FIG. 4 is a vertically cross sectional view under a condition where the aluminum electric wire is inserted into the earth terminal after the rotary swaging process.
Figure 5:
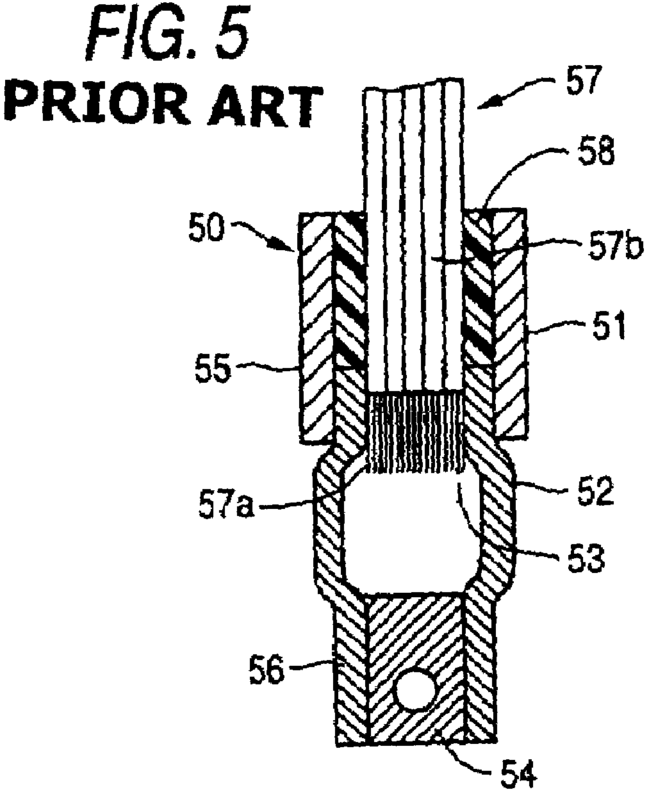
FIG. 5 PRIOR ART
FIG. 5 is a cross sectional view showing one example of the prior connecting method of the terminal and the electric wire.

FIG. 4 shows a cross sectional view of the earth terminal 10 and the aluminum electric wire 28 after the rotary swaging process. The large hole portion **24*a* and the small hole portion 24*b* are tightened so as to be coaxial with each other. In the large hole portion 24*a* of the electric wire insertion hole 24, the insulation covering portion 30 is closely adhered to the hole inside. In the small hole portion 24*b* of the electric wire insertion hole 24, the core wire portion 29 is closely adhered to the hole inside. In the hole end 27 of the electric wire insertion hole 24, the nickel paste stays, and the space 16 of the hole end 27** is closed.

By the way, the embodiment employs the nickel paste 32 as the conductive adhesive, but for the electric wire 28 or the earth terminal 10 made of the aluminum alloy, a carbon paste of low contact resistance may be used. For an electric wire or an earth terminal made of the Cu alloy, a silver paste of low contact resistance may be served.

As mentioned above, according to the invention set forth in the first aspect, filling the conductive adhesive on the hole end of the wire connection part, inserting the electric wire, and then evenly tightening the tubular wall, the conductive adhesive infiltrates into the space in the side of the wire connection part owing to pressure, and the space is closed with the conductive adhesive to prevent the water from invading from an exterior. Accordingly, the waterproof may be provided at the wire connection part without using the water tight member as another member, so that the number of parts and members is curtailed and the cost-down may be attained. Also the conductive adhesive infiltrates into between the wires to lower the contact resistance between the mutual wires and improve the electrical conductivity.

According to the invention of the second aspect, the rotary swaging tightens the tubular wall of the wire connection part all over the circumference by even force, so that the terminal and the electric wire are closely adhered. Accordingly, no space is formed between the terminal and the electric wire, and the waterproofing property and the electrical conductivity of the wire connection part are heightened.

According to the invention of the third aspect, since the epoxy resin as the binder is thermosetting, the curing time is short to heighten the connection workability of the terminal and the electric wire. Further since the epoxy resin is irreversible, if being once hardened, softening is difficult, so that the electrical conductivity is maintained for a long period of time. The nickel powder is conductive, and therefore, the electrical conductivity between the core wire portion and the wire connection part is good.

According to the invention of the fourth aspect, the nickel paste and the aluminum alloy contact at low contact resistance, and the satisfactory electrical conductivity may be available. In addition, since the nickel powder breaks through the oxidized film of the aluminum alloy and directly contacts the underground layer, the terminal and the electric wire can be connected without performing a pretreatment for removing the oxidized film and the connection workability goes up. Further, if using the aluminum electric wire, a vehicle such as an automobile is lightened.

What is claimed is:

1. A method of connecting a terminal and an electric wire, wherein the terminal includes an electric contact part at one side thereof and a tubular wire connection part at another end thereof comprising the steps of:

filling a conductive adhesive on a hole end of the wire connection part;

inserting the electric wire from a hole opening of the wire connection part toward the hole end, and tightening uniformly a tubular wall of the wire connection part, thereby infiltrating the conductive adhesive into a space of the electric contact part and gaps between core wires of said electric wire.

2. The method of connecting the terminal and the electric wire as set forth in claim 1, further comprising tightening the tubular wall of the wire connection part by a rotary swaging process.

3. The method of connecting the terminal and the electric wire as set forth in claim 2, wherein the conductive adhesive is a nickel paste which is a mixture of nickel powders in a liquid epoxy resin based binder.

4. The method of connecting the terminal and the electric wire as set forth in claim 1, wherein at least one of a core wire portion of the electric wire or the terminal is aluminum or aluminum alloy.

* * * * *